(12) United States Patent
Whikehart et al.

(10) Patent No.: US 8,094,809 B2
(45) Date of Patent: Jan. 10, 2012

(54) FRAME-BASED LEVEL FEEDBACK CALIBRATION SYSTEM FOR SAMPLE-BASED PREDICTIVE CLIPPING

(75) Inventors: J. William Whikehart, Milford, MI (US); Suresh Ghelani, Canton, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 912 days.

(21) Appl. No.: 12/118,877

(22) Filed: May 12, 2008

(65) Prior Publication Data

US 2009/0278594 A1 Nov. 12, 2009

(51) Int. Cl.
*H04M 9/08* (2006.01)

(52) U.S. Cl. ......... 379/406.01; 379/406.02; 379/406.03; 379/406.04; 379/406.05; 379/406.06; 379/406.07; 379/406.08; 379/406.09; 379/406.1; 379/406.11; 379/406.12; 379/406.13; 379/406.14; 379/406.15; 379/406.16; 381/56; 381/104; 381/109; 381/59; 381/86; 381/58; 381/94.1; 381/94.2; 381/94.3; 381/94.4; 381/71.1; 381/71.4; 381/71.11; 381/71.12; 381/66; 327/590

(58) Field of Classification Search .................. None
See application file for complete search history.

(56) References Cited

U.S. PATENT DOCUMENTS

| | | | |
|---|---|---|---|
| 5,263,019 A | 11/1993 | Chu | |
| 5,492,129 A | 2/1996 | Greenberger | |
| 5,539,731 A | 7/1996 | Haneda et al. | |
| 5,821,889 A | 10/1998 | Miller | |
| 6,212,273 B1 | 4/2001 | Hemkumar et al. | |
| 6,885,752 B1 | 4/2005 | Chabries et al. | |
| 6,914,987 B2 | 7/2005 | Blind et al. | |
| 7,020,297 B2 | 3/2006 | Fang et al. | |
| 7,171,003 B1 | 1/2007 | Venkatesh et al. | |
| 7,202,731 B2 | 4/2007 | Krochmal et al. | |
| 2002/0159585 A1* | 10/2002 | Janse | 379/406.01 |
| 2006/0227978 A1 | 10/2006 | Truong et al. | |
| 2007/0009109 A1* | 1/2007 | Ise et al. | 381/94.2 |
| 2007/0019824 A1 | 1/2007 | Osmanovic et al. | |
| 2007/0104335 A1 | 5/2007 | Shi et al. | |

* cited by examiner

*Primary Examiner* — Hrayr A Sayadian
(74) *Attorney, Agent, or Firm* — Fraser Clemens Martin & Miller LLC; J Douglas Miller

(57) ABSTRACT

A feedback calibration system and a method for controlling an electronic signal are disclosed. The feedback calibration system includes an input controller adapted to modify an input signal in response to a control signal and generate a modified input signal, a signal processing block including a signal analyzer, wherein the signal processing block is adapted to process the modified input signal to generate an output signal and the signal analyzer is adapted to detect an undesirable condition of the output signal and transmit a detection signal corresponding to the undesirable condition, a transfer function estimator adapted to model and transmit a transfer function estimate of the signal processing block in real-time in response to the detection signal, and a programmable device adapted to transmit the control signal to the input controller for modifying the input signal, wherein the control signal is based upon the transfer function estimate.

20 Claims, 1 Drawing Sheet

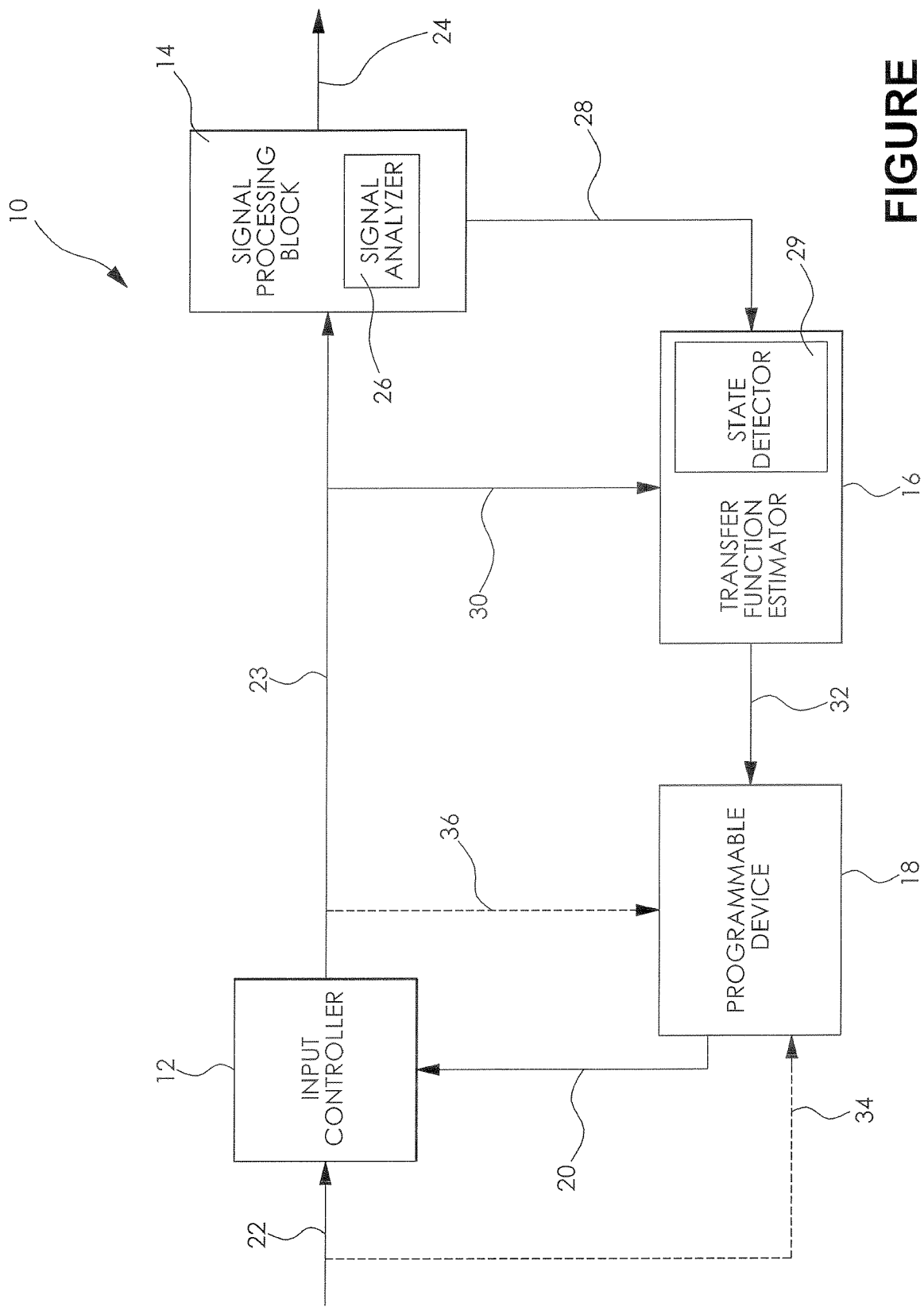

FRAME-BASED LEVEL FEEDBACK CALIBRATION SYSTEM FOR SAMPLE-BASED PREDICTIVE CLIPPING

FIELD OF THE INVENTION

The present invention relates to signal processing blocks. More particularly, the invention is directed to a frame-based feedback calibration system and a method for controlling an electronic signal.

BACKGROUND OF THE INVENTION

Traditionally, audio amplifiers have included a feedback mechanism that detects clipping or a certain distortion level at the amplifier output. The feedback mechanism transmits a detection signal to an earlier point in the signal path before an input to the amplifier, so that clipping can be avoided or a maximum distortion level can be maintained adaptively. The feedback clip detection signal is sometimes called "clip detect", and is monitored continuously to control clipping and distortion. In digital signal processing (DSP) based amplifiers, the process of monitoring the clip detect is usually on a sample-by-sample basis, at the audio sample rate. This allows for a fast reaction time to react to clipping and to reduce the level of the input signal to the amplifier.

The processing architectures for DSP-based amplifiers are currently moving to using frame-based processing, where a function or set of functions are performed simultaneously on all audio samples of a set of contiguous audio samples. Such a set may be 128 samples long, for example. This processing approach is used because it allows processing efficiencies.

A problem with frame-based processing is that signals such as clip detect change much faster than the rate that frames are processed (the audio sample rate divided by the frame size). The state of the clip detect that is used as an input to processing within the frame can only be the state that exists at the frame boundaries. The processing within the frame includes processing to adjust the audio level to avoid clipping or excessive distortion, according to the state of clip detect. However, this process may not provide sufficient control of the audio level, since the clip detect is most likely changing faster than the value of clip detect used during the processing in the frame. Thus, excessive clipping and distortion may result or excessive reduction of the signal may result.

Currently, one method is to allow processing interrupts to occur when the clip detect indicates that clipping has occurred. By allowing processing interrupts, normal frame-based processing flow is broken, which causes significant processing inefficiency.

Various algorithms exist for controlling clipping and distortion. These algorithms process the signal prior to its input to the amplifier. A class of algorithms may be described as "predictive", where the algorithm attempts to predict when clipping or excessive distortion will occur, such prediction being performed without the aid of a clip detect feedback signal. These algorithms may be described as "feed-forward", since they do not use feedback. These algorithms depend on using an accurate Vout vs. Vin or distortion vs. Vin transfer function model of the amplifier so that its point of clipping or points of certain distortion levels are known beforehand. This transfer function must be characterized during the product design process, and therefore must be stable with respect to temperature, voltage, and design changes due to other factors in the development process. This stability may not be possible, expensive or inconvenient.

In one implementation, for control of the maximum audio input level to an amplifier to control clipping and distortion when no clip detect signal is available, the control method is based on a transfer function determined when the particular copy of the amplifier is built and tested. Such calibration steps add cost to produce the unit as well as to prove-out and maintain the calibration process.

In another implementation, the transfer function is determined when the amplifier is designed, based on analysis of all possible variations of the transfer function due to parts and production variations. Design margin may be added. This approach either adds cost to the design, by using tighter-tolerance components and manufacturing so that a maximum desired power output is available, or this approach forces the maximum desired power output to be reduced. Amplifier power output is a key customer characteristic and is typically rated by third-parties in the industry for use by consumers.

It would be desirable to have a feedback calibration system and a method for controlling an electronic signal, wherein the feedback calibration system and the method militate against an undesirable condition of the electronic signal during a signal processing by incorporating a real-time transfer function estimate in the processing of the electronic signal.

SUMMARY OF THE INVENTION

Concordant and consistent with the present invention, a feedback calibration system and a method for controlling an electronic signal, wherein the feedback calibration system and the method militate against an undesirable condition of the electronic signal during a signal processing by incorporating a real-time transfer function estimate in the processing of the electronic signal, has surprisingly been discovered.

In one embodiment, a feedback calibration system comprises an input controller adapted to modify an input signal in response to a control signal and generate a modified input signal, a signal processing block including a signal analyzer, wherein the signal processing block is adapted to process the modified input signal to generate an output signal and the signal analyzer is adapted to detect an undesirable condition of the output signal and transmit a detection signal corresponding to the undesirable condition, a transfer function estimator adapted to model and transmit a transfer function estimate of the signal processing block in real-time in response to the detection signal, and a programmable device adapted to transmit the control signal to the input controller for modifying the input signal, wherein the control signal is based upon the transfer function estimate.

In another embodiment, a feedback calibration system comprises an input controller adapted to modify an input signal in response to a control signal and generate a modified input signal, a signal processing block including a signal analyzer, wherein the signal processing block is adapted to process the modified input signal to generate an output signal and the signal analyzer is adapted to detect an undesirable condition of the output signal and transmit a detection signal corresponding to the undesirable condition, a transfer function estimator adapted to model and transmit a transfer function estimate of the signal processing block in real-time, wherein the transfer function estimate is based on an average amplitude of the modified input signal and an average amplitude of the detection signal, and a programmable device adapted to transmit the control signal to the input control for modifying the input signal, wherein the control signal is based upon the transfer function estimate.

The invention also provides methods for controlling an electronic signal.

One method comprises the steps of: providing an input controller adapted to modify an input signal and generating a modified input signal from the input controller in response to a control signal; providing an signal processing block including a signal analyzer, wherein the signal processing block is adapted to process the modified input signal and the clip signal analyzer is adapted to detect an undesirable condition of the processed modified input signal and transmit a detection signal corresponding to the undesirable condition; modeling and transmitting a transfer function estimate of the signal processing block in real-time in response to the detection signal; and providing a programmable device adapted to receive the transfer function estimate and transmitting the control signal to the input control for modifying the input signal, wherein the control signal is based upon the transfer function estimate.

BRIEF DESCRIPTION OF THE DRAWINGS

The above, as well as other advantages of the present invention will become readily apparent to those skilled in the art from the following detailed description of the preferred embodiment when considered in the light of the accompanying drawing which is a schematic diagram of a feedback calibration system according to an embodiment of the present invention.

DETAILED DESCRIPTION OF EXEMPLARY EMBODIMENTS OF THE INVENTION

The following detailed description and appended drawings describe and illustrate various embodiments of the invention. The description and drawings serve to enable one skilled in the art to make and use the invention, and are not intended to limit the scope of the invention in any manner. In respect of the methods disclosed, the steps presented are exemplary in nature, and thus, the order of the steps is not necessary or critical.

Referring to the FIGURE, there is illustrated a feedback calibration system 10 according to an embodiment of the present invention. The feedback calibration system 10 includes an input controller 12, a signal processing block 14, a transfer function estimator 16, and a programmable device 18. As shown, the feedback calibration system 10 is adapted to process audio signals using frame-based processing. It is understood that other signals and other processing may be used, as desired.

The input controller 12, in electrical communication with the programmable device 18, is adapted to receive a control signal 20 from the programmable device 18. The input controller 12 is further adapted to control characteristics of an input signal 22 such as amplitude, for example. Specifically, the input controller 12 implements signal modifications based upon the control signal 20 and transmits the input signal 22, in a modified state, as a modified input signal 23 to the signal processing block 14. As a non-limiting example, the input controller 12 may be a gain controller. Other devices may be used, as desired.

The signal processing block 14 is adapted to receive the modified input signal 23, analyze and process the input signal 23, and transmit an output signal 24 corresponding to the processed input signal 23. As a non-limiting example, the signal processing block 14 may be an amplifier adapted to amplify the input signal 23. In the embodiment shown, the signal processing block 14 includes a signal analyzer 26 adapted to detect an undesirable condition of the output signal 24. As a non-limiting example, the signal analyzer 26 may be adapted to detect a clipping or a distortion of the output signal 24. Other characteristics and undesirable conditions may be detected, as desired. The signal analyzer 26 is further adapted to transmit a detection signal 28. The detection signal 28 represents the undesirable characteristics of the output signal 24. As a non-limiting example, the detection signal 28 is a digital logic signal. Other signals may be used, as desired.

The transfer function estimator 16 is adapted to receive the detection signal 28. In certain embodiments, the transfer function estimator 16 receives the detection signal 28 in real-time and processes the detection signal 28 using frame-based processing techniques. In other embodiments, the transfer function estimator 16 receives characteristics of the detection signal 28 derived from the detection signal 28 or signal analyzer 26. As shown, the transfer function estimator 16 includes a state detector 29 adapted to detect and process the characteristics of the detection signal 28. For example, the state detector 29 is adapted to analyze and process the current logic state and average state of the detection signal 28. In certain embodiments, the state detector 29 analyzes the detection signal 28 at frame boundaries. In other embodiments, the state detector 29 is adapted to analyze the detection signal 28 at least once within the frame.

Specifically, the transfer function estimator 16, in cooperation with the state detector 29, averages the detection signal 28 at the frame boundaries of a plurality of sampled frames of the detection signal 28 using at least one of a finite impulse response (FIR) filtering and an infinite impulse response (IIR) filtering, for example. It is understood that other processes for averaging the detection signal 28 may be incorporated into the transfer function estimator 16. The transfer function estimator 16 is also adapted to receive an audio level estimate 30 based on at least a portion of audio samples within the frame of the modified input signal 23. For example, the transfer function estimator 16 receives the input signal 23 and measures the audio level at an end of a desired frame of the input signal 23. As a non-limiting example, the audio level estimate 30 may be averaged using at least one of an FIR filtering and an IIR filtering. It is understood that other processes for averaging the audio level estimate 30 may be incorporated into the transfer function estimator 16. It is further understood that the process for averaging the detection signal 28 and the audio level estimate 30 may use separate attack and decay time constants, and may be configured to act as leaky peak-detectors. Where FIR filtering is used, the filtering process may include coefficients that weigh more recent detection signals 28 and audio level estimate 30 values. It is understood that the state detector 29 may be separated from the transfer function estimator 16 and adapted to transmit a state signal (not shown) representing the characteristics of the detection signal 28 to the transfer function estimator 16. As a non-limiting example, the state detector 29 may be adapted to detect at least one of a clipping and a distortion within a previous sampled frame. It is understood that the state detector 29 may also be adapted to be cleared at the frame boundaries after a state signal is transmitted to the transfer function estimator 16.

The transfer function estimator 16 is further adapted to calculate and transmit a transfer function estimate 32 or a significant characteristic of the transfer function estimate 32 such as clipping level. In certain embodiments, the transfer function estimate is based on the received detection signal 28 and the audio level estimate 30. It is understood that the transfer function estimate 32 is an adjustable model of a transfer function of the signal processing block 14. It is further understood that changes in at least one of the detection signal 28 and the audio level estimate 30 will be incorporated in the transfer function estimate 32. The transfer function estimator 16 is further adapted to update the transfer function estimate 32 and transmit the transfer function estimate 32 to the programmable device 18.

For example, in certain embodiment, a set of pairs of values (A,B) are maintained, where A is the average amplitude of the modified input signal 23 and B is the corresponding average value of the detection signal 28. The specific pairs that are maintained are selected such that the averaged detection signal 28 values cover a significant portion of the possible range of the averaged detection signal 28 values. A newly formed incoming pair may or may not replace an existing pair in the maintained set depending on, whether the replacement of an existing pair in the set by the newly formed pair increases the coverage of the possible range of the averaged detection signal 28 values. The maintained pairs are subsequently used to estimate the specific average amplitude corresponding to the point on the transfer function where clipping does not occur for average amplitudes below this specific average amplitude and clipping does occur for average amplitudes above this specific average amplitude. Although a minimum of two pairs are maintained, maintaining more pairs provides a more accurate estimate of the aforementioned point on the transfer function.

In other embodiments, for each input of the average amplitude of the modified input signal 23, where the value of the detection signal 28 indicates no undesirable conditions of the output signal 24 and the average amplitude is higher than a previously saved low value of the average amplitude, the saved low value is replaced by the inputted average amplitude. Similarly, where the value of the detection signal 28 indicates an undesirable condition of the output signal 24 and the average amplitude of the modified input signal 23 is lower than a previously saved high value of the average amplitude, the saved high value is replaced by the inputted average amplitude. Where neither of these conditions hold, the inputted average amplitude is discarded. By repeated executions on these rules, once per frame, the values of the saved low and high values will converge to the specific average amplitude corresponding to the point on the transfer function where an undesirable condition of the output signal 24 exists for average amplitudes above this specific average amplitude and an undesirable condition of the output signal 24 does not exist for average amplitudes below this specific average amplitude. It is understood that an alternative to replacing or discarding the low and high values, a filter function for each of the low and high values can be performed, wherein for each filter function, the filter function input is the average amplitude and the filter function output is saved value. It is understood that the filter function may include nonlinear operations such as attack and decay processing, hysteresis, and dwell timing to regulate the filter function output, as is known in the art.

The programmable device 18 is in electrical communication with the input controller 12 and the transfer function estimator 16. The programmable device 18 is adapted to receive the transfer function estimate 32, process and analyze the transfer function estimate 32, and transmit a control signal 20 based upon the processing of the transfer function estimate 32. It is understood that the desired processing and analysis of the transfer function estimate 32 and the transmission of the control signal 20 may be pre-programmed by a user. It is further understood that the desired processing and analysis of the transfer function estimate 32 and the transmission of the control signal 20 may be adjusted by a user through the programmable device 18. In certain embodiments, the programmable device 32 is adapted to receive a feed forward signal 34 corresponding to the input signal 22. Where a feed forward signal 34 is received by the programmable device 18, the programmable device 18 generates the control signal 20 in response to an analysis and comparison of the transfer function estimate 32 and the feed forward signal 34. In other embodiments, the programmable device 32 is adapted to receive a direct feedback signal 36 corresponding to the modified input signal 23. Where a direct feedback signal 36 is received by the programmable device 18, the programmable device 18 generates the control signal 20 in response to an analysis and comparison of the transfer function estimate 32 and the direct feedback signal 36. The programmable device 18 may further include a means for controlling the processing and analyzing functions of the programmable device 18 such as a user interface, for example.

In operation, the input signal 22 is modified by the input controller 12 and transmitted as the modified input signal 23 to the signal processing block 14. The signal processing block 14 receives the input signal 23 and transmits a processed input signal 23 as an output signal 24. Meanwhile, the transfer function estimator 16 calculates a transfer function estimate 32 based on the received detection signal 28 and the audio level estimate 30. Specifically, the transfer function estimator 16 compares an average value of the detection signal 28 to an average value of the audio level estimate 30 to calculate an audio level at which the signal processing block 14 clips on-the-average. It is understood that the transfer function estimator 16 may be adapted to calculate the audio level at which other undesirable conditions of the output signal 24 are present. The transfer function estimator 32 includes the comparison of the detection signal 28 and the audio level estimate 30 as a reference point in the transfer function estimate 32. As a non-limiting example, a sine wave with level X that is being clipped at 75% of its full amplitude will have a ratio of the time during clipping to the sine wave period of about 45%. Thus, the detection signal 28 will be at logic 1 for 45% of the time, otherwise it will be at logic 0. Where the detection signal 28 is sampled at the frame boundaries, the average of these samples will also be 45%. Thus, level X corresponds to 75% clipping, so the reference point in the transfer function is at 75% of X. As the average level of the detection signal 28 and the audio level estimate 30 fluctuate, the transfer function estimator 16 updates the transfer function estimate 32 and transmits the updated transfer function estimate 32 to the programmable device 18. The programmable device 18 incorporates the transfer function estimate 32 into a user-programmed process resulting in the transmission of the control signal 20 to the input control 12. It is understood that the user-programmed process may incorporate the analysis of at least one of the feed forward signal 34 and the feedback signal 36. The control signal 20 provides a predictive control of the input signal 22 to militate against an undesirable condition of the output signal 24 generated by the signal processing block 14. It is understood that the processes and calculation of the transfer function estimator 16 and the programmable device 18 provide a desirable control of the input signal 22 within a desired frame. Specifically, by comparing an average value of the detection signal 28 to an average value of the audio level estimate 30 to calculate an audio level at which the signal processing block 14 clips on-the-average, the transfer function estimate 32 changes slowly over time.

The feedback calibration system 10 and the method for controlling the input signal 22 provide for a frame-based signal processing of the input signal 22. The feedback calibration system 10 and the method for controlling an electronic signal further provide an efficient and reliable means for controlling the input signal 22 during a signal processing by incorporating a real-time transfer function estimate 32 in a processing of the input signal 22.

From the foregoing description, one ordinarily skilled in the art can easily ascertain the essential characteristics of this invention and, without departing from the spirit and scope thereof, make various changes and modifications to the invention to adapt it to various usages and conditions.

What is claimed is:

1. A feedback calibration system for a signal processing block, the feedback calibration system comprising:
   an input controller adapted to modify an input signal in response to a control signal and generate a modified input signal;
   a signal processing block including a signal analyzer, wherein the signal processing block is adapted to process the modified input signal to generate an output signal and the signal analyzer is adapted to detect an undesirable condition of the output signal and transmit a detection signal corresponding to the undesirable condition;

a transfer function estimator adapted to model and transmit a transfer function estimate of the signal processing block in real-time in response to the detection signal; and a programmable device adapted to transmit the control signal to the input controller for modifying the input signal, wherein the control signal is based upon the transfer function estimate.

2. The feedback calibration system according to claim 1, wherein the transfer function estimate is based upon an average amplitude of the modified input signal and an average amplitude of the detection signal.

3. The feedback calibration system according to claim 2, wherein the average amplitude of the modified input signal is determined at the edge of a desired sample frame by at least one of a finite impulse response (FIR) filtering and an infinite impulse response (IIR) filtering.

4. The feedback calibration system according to claim 2, wherein the average amplitude of the detection signal is determined by at least one of a finite impulse response (FIR) filtering and an infinite impulse response (IIR) filtering.

5. The feedback calibration system according to claim 4, wherein the average amplitude of the detection signal is determined at the frame boundaries of a plurality of sampled frames of the detection signal.

6. The feedback calibration system according to claim 1, wherein the transfer function estimate is based on an average amplitude of the modified input signal, previously stored low and high values of the average amplitude and a value of the detection signal.

7. The feedback calibration system according to claim 1, wherein the transfer function estimator includes a state detector adapted to detect and process a value of the detection signal.

8. The feedback calibration system according to claim 1, wherein the programmable devices is adapted to receive and process at least one of a feed forward signal corresponding to the input signal and a direct feedback signal corresponding to the modified input signal and the control signal is based upon an analysis and comparison of the transfer function estimate and at least one of the feed forward signal and direct feedback signal.

9. A feedback calibration system for an signal processing block, the feedback calibration system comprising:

an input controller adapted to modify an input signal in response to a control signal and generate a modified input signal;

a signal processing block including a signal analyzer, wherein the signal processing block is adapted to process the modified input signal to generate an output signal and the signal analyzer is adapted to detect an undesirable condition of the output signal and transmit a detection signal corresponding to the undesirable condition;

a transfer function estimator adapted to model and transmit a transfer function estimate of the signal processing block in real-time, wherein the transfer function estimate is based on an average amplitude of the modified input signal and an average amplitude of the detection signal; and a programmable device adapted to transmit the control signal to the input controller for modifying the input signal, wherein the control signal is based upon the transfer function estimate.

10. The feedback calibration system according to claim 9, wherein the average amplitude of the modified input signal is determined at the edge of a desired sample frame by at least one of a finite impulse response (FIR) filtering and an infinite impulse response (IIR) filtering.

11. The feedback calibration system according to claim 9, wherein the average amplitude of the detection signal is determined by at least one of a finite impulse response (FIR) filtering and an infinite impulse response (IIR) filtering.

12. The feedback calibration system according to claim 11, wherein the average amplitude of the detection signal is determined at the frame boundaries of a plurality of sampled frames of the detection signal.

13. The feedback calibration system according to claim 9, wherein the transfer function estimator includes a state detector, the state detector adapted to determine the average value of the detection signal.

14. A method for controlling an electronic signal, the method comprising the steps of:

providing an input controller adapted to modify an input signal and generating a modified input signal from the input controller in response to a control signal;

providing a signal processing block including a signal analyzer, wherein the signal processing block is adapted to process the modified input signal and the signal analyzer is adapted to detect an undesirable condition of the processed modified input signal and transmit a detection signal corresponding to the undesirable condition;

modeling and transmitting a transfer function estimate of the signal processing block in real-time in response to the detection signal; and providing a programmable device adapted to receive the transfer function estimate and transmitting the control signal to the input controller for modifying the input signal, wherein the control signal is based upon the transfer function estimate.

15. The method according to claim 14, wherein the transfer function estimate is based upon an average amplitude of the modified input signal and an average amplitude of the clip detect signal.

16. The method according to claim 15, wherein the average amplitude of the modified input signal is determined at the edge of a desired sample frame by at least one of a finite impulse response (FIR) filtering and an infinite impulse response (IIR) filtering.

17. The method according to claim 15, wherein the average amplitude of the detection signal is determined by at least one of a finite impulse response (FIR) filtering and an infinite impulse response (IIR) filtering.

18. The method according to claim 17, wherein the average amplitude of the clip detect signal is determined at the frame boundaries of a plurality of sampled frames of the detection signal.

19. The method according to claim 14, wherein the transfer function estimate is based on an average amplitude of the modified input signal, previously stored low and high values of the average amplitude and a value of the detection signal.

20. The method according to claim 14, wherein the transfer function estimator includes a state detector, the state detector adapted to detect and process value of the detection signal.

* * * * *